United States Patent
Song et al.

(10) Patent No.: US 9,299,950 B2
(45) Date of Patent: Mar. 29, 2016

(54) ORGANIC LIGHT EMITTING DISPLAY APPARATUS

(71) Applicant: Samsung Display Co., Ltd., Gyeonggi-do (KR)

(72) Inventors: Young-Woo Song, Yongin (KR); Jin-Koo Chung, Yongin (KR); Kyu-Hwan Hwang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 142 days.

(21) Appl. No.: 14/071,001

(22) Filed: Nov. 4, 2013

(65) Prior Publication Data

US 2014/0367651 A1   Dec. 18, 2014

(30) Foreign Application Priority Data

Jun. 18, 2013   (KR) .................. 10-2013-0069955

(51) Int. Cl.
*H01L 27/32* (2006.01)
*H01L 51/52* (2006.01)

(52) U.S. Cl.
CPC .......... *H01L 51/525* (2013.01); *H01L 51/5221* (2013.01); *H01L 51/5228* (2013.01)

(58) Field of Classification Search
CPC ............ H01L 27/3244; H01L 27/3276; H01L 27/3288; H01L 51/5234; H01L 51/524; H01L 51/5243; H05K 1/189; H05K 2201/10128

USPC ................ 313/500, 504–505; 257/40, 88, 99, 257/E33.066, 433, 734; 438/29, 27, 82, 99

See application file for complete search history.

(56) References Cited

U.S. PATENT DOCUMENTS

| | | |
|---|---|---|
| 2005/0127818 A1 | 6/2005 | Ohtani |
| 2005/0269945 A1 | 12/2005 | Su |
| 2008/0012476 A1* | 1/2008 | Kim et al. ...................... 313/504 |
| 2010/0096655 A1* | 4/2010 | Lee et al. ........................ 257/98 |
| 2010/0102714 A1* | 4/2010 | Kim et al. ...................... 313/504 |
| 2011/0198598 A1* | 8/2011 | Kim et al. ........................ 257/59 |

FOREIGN PATENT DOCUMENTS

| | | |
|---|---|---|
| JP | 2011-029022 | 2/2011 |
| KR | 10-2008-0097327 A | 11/2008 |
| KR | 10-1176026 | 8/2012 |

* cited by examiner

*Primary Examiner* — David Vu
*Assistant Examiner* — Jonathan Han
(74) *Attorney, Agent, or Firm* — Lee & Morse, P.C.

(57) ABSTRACT

An organic light emitting display apparatus includes a lower substrate and an upper substrate. The lower substrate includes a light emitting device having an organic emission layer between first and second electrodes, and an auxiliary electrode under and electrically connected to the second electrode. The upper substrate includes an embossing member contacting the second electrode. The embossing member is coupled to the upper substrate to face the lower substrate and applies a pressure to establish an electrical connection between the auxiliary electrode and the second electrode.

21 Claims, 6 Drawing Sheets

ORGANIC LIGHT EMITTING DISPLAY APPARATUS

CROSS-REFERENCE TO RELATED APPLICATION

Korean Patent Application No. 10-2013-0069955, filed on Jun. 18, 2013, in the Korean Intellectual Property Office, and entitled, "Organic Light Emitting Display Apparatus," is incorporated by reference herein in its entirety.

BACKGROUND

1. Field

One or more embodiments described herein relate to a display apparatus.

2. Description of the Related Art

An organic light emitting display apparatus is considered to be one of the next-generation display apparatuses because of its wide viewing angle, a high contrast, and fast response speed. An organic light emitting display apparatus may include an organic layer including an emission layer between first and second electrodes.

SUMMARY

An organic light emitting display apparatus may include a lower substrate including a light emitting device having an organic emission layer between first and second electrodes, and an auxiliary electrode under and electrically connected to the second electrode; and an upper substrate including an embossing member contacting the second electrode, wherein the embossing member is coupled to the upper substrate to face the lower substrate.

The light emitting device may further include an organic functional layer disposed between at least one of the first electrode or the second electrode and the organic emission layer, the organic functional layer extending outside an area where the auxiliary electrode contacts the second electrode The organic functional layer may include at least one of a hole injection layer, a hole transport layer, an electron transport layer, or an electron injection layer.

The embossing member may directly contact the auxiliary electrode, to apply a pressure to cause the auxiliary electrode to electrically connect to the second electrode. The auxiliary electrode and the second electrode may directly contact each other. The embossing member may contact the second electrode at a location above the second electrode. The auxiliary electrode and the second electrode may contact one another through a break area in the organic functional layer.

The embossing member may include an organic insulating material. The embossing member may include a first pattern which includes an organic insulating material and a second pattern which includes a conductive material on the first pattern.

The lower substrate may include a thin film transistor electrically connected to the first electrode of the light emitting device.

The auxiliary electrode may be at a same level as a conductive layer configuring the thin film transistor. The auxiliary electrode may be at a same level as the first electrode of the light emitting device.

An organic light emitting display apparatus may include a first electrode on a lower substrate; a second electrode facing the first electrode; an organic emission layer between the first and second electrodes and an organic functional layer between at least one of the first electrode or second electrode and the organic emission layer; an auxiliary electrode electrically connected to the second electrode; and an embossing member coupled to an upper substrate which faces the lower substrate, wherein the embossing member contacts at least one of the auxiliary electrode or the second electrode.

The organic functional layer may include at least one of a hole injection layer, a hole transport layer, an electron transport layer, or an electron injection layer.

The embossing member may directly contact the auxiliary electrode, and the auxiliary electrode may electrically connect to the second electrode based on the direct contact between the embossing member and the auxiliary electrode.

The auxiliary electrode may electrically connect to the second electrode based on direct contact between the auxiliary electrode and the second electrode, and wherein the embossing member contacts the second electrode at a location above the second electrode. The embossing member includes an organic insulating material. The embossing member may include a first pattern including an organic insulating material and a second pattern including a conductive material on the first pattern. The organic functional layer may be located outside an area where the auxiliary electrode contacts the second electrode. The auxiliary electrode and the second electrode may contact one another through a break area in the organic functional layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
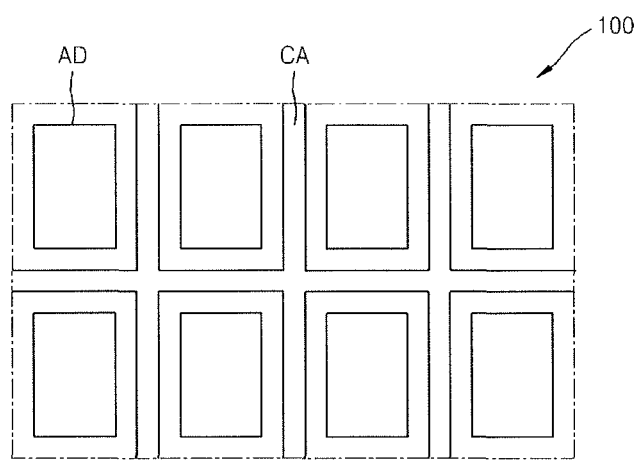
FIG. 1 illustrates an embodiment of an organic light emitting display apparatus.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of an organic light emitting display apparatus 100 which includes auxiliary electrodes CA around anode electrodes AD on a lower substrate. The auxiliary electrodes CA may be formed at the same layer as the anode electrode AD or at a different layer from the anode electrode AD.

The auxiliary electrodes CA are formed as gratings. However, the auxiliary electrodes CA may have a different shape or arrangement in other embodiments, provided the auxiliary electrode CA is electrically separated from the anode electrode AD and electrically connected to a cathode electrode, which may serve as a common electrode.

For example, the auxiliary electrode CA may be formed in a zig-zag pattern or a stripe pattern in a column direction or a row direction. In addition, a width of the auxiliary electrode CA may vary, for example, according to a size of a pixel, and/or a density or a size of the auxiliary electrode CA may vary depending on pixel areas and/or other panel size requirements. If the auxiliary electrode CA is formed at a different layer from the anode electrode AD, the auxiliary electrode CA may partially overlap with the anode electrode AD.

In a top emission-type apparatus, a cathode electrode is deposited on an entire surface using an open mask and is formed to have a small thickness with an optical transmittance. In this case, a voltage drop (IR drop) may occur as a result of high surface resistance. Accordingly, a driving voltage may increase or a driving voltage margin may decrease, thereby degrading a long range uniformity (LRU).

According to one or more embodiments, the cathode electrode and the auxiliary electrode CA are electrically connected to each other, in order to reduce IR drop at the cathode electrode. Also, the auxiliary electrode CA may contact the cathode electrode with a predetermined interval or spacing.

Figure 2:
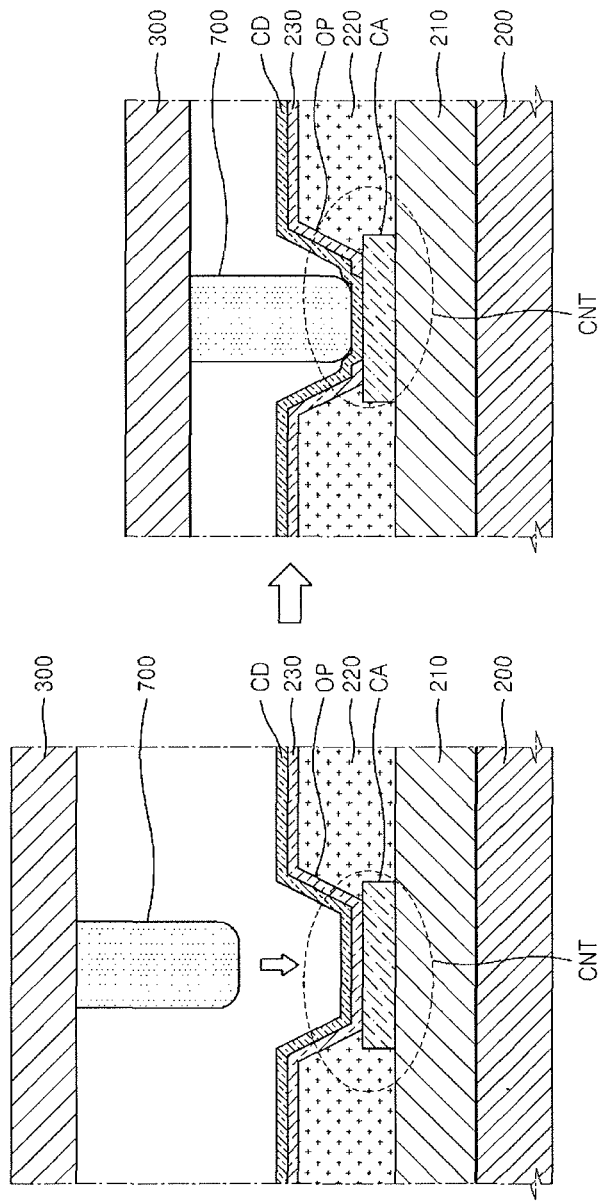
FIG. 2 illustrates a contact between a cathode and an auxiliary electrode in the apparatus of FIG. 1.

FIG. 2 illustrates one embodiment for establishing contact between the cathode electrode and the auxiliary electrode. Referring to FIG. 2, the auxiliary electrode CA is formed on a lower substrate 200, and a part of the auxiliary electrode CA is exposed by an opening OP in a contact area CNT. One or more contact areas CNT may be formed. Also, one or more insulating layers 210 and 220 may be formed between the lower substrate 200 and the cathode electrode CD. An organic layer 230 and the cathode electrode CD may be sequentially formed in the opening OP of the auxiliary electrode CA. The organic layer 230 may include at least one of a hole injection layer (HIL), a hole transport layer (HTL), an electron transport layer (ETL), or an electron injection layer (EIL).

In addition, an embossing member or surface 700 is formed on a surface of an upper substrate 300, which faces the lower substrate 200. The embossing member 700 is formed on a location corresponding to the contact area CNT of the lower substrate 200.

Figure 3:
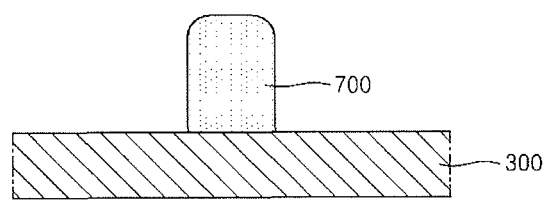
FIGS. 3 and 4 illustrate examples of an embossing member in FIG. 2.
Figure 4:
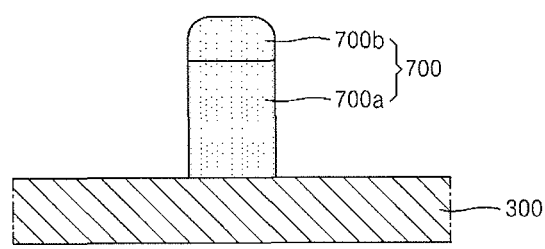

FIGS. 3 and 4 are diagrams showing examples of the embossing member 700 shown in FIG. 2. As shown in FIG. 3, the embossing member 700 may be formed by depositing an insulating material, for example, a photo-resistor on a surface of the upper substrate 300 and patterning the photo-resistor.

As shown in FIG. 4, the embossing member 700 may include a first pattern 700a that is formed of an insulating material, for example, a photo-resistor on the surface of the upper substrate 300, and a second pattern 700b formed of a conductive material, for example, metal on the first pattern 700a. The first pattern 700a and the second pattern 700b may be formed, for example, by depositing the insulating material and the conductive material sequentially and etching the insulating material and the conductive material simultaneously.

Alternatively, the insulating material may be deposited and patterned to form the first pattern 700a, and the conductive material may be patterned so as to remain on the first pattern 700a only to form the second pattern 700b. The second pattern 700b may have a thickness that is greater than a thickness of the organic layer 230. The second pattern 700b may be formed to have a single-layered structure or a multi-layered structure by using one or more conductive materials, for example, may have a triple-layered structure including Mo/Al/Mo. When the embossing member 700 includes the second pattern 700b, contact between the cathode electrode CD and the auxiliary electrode CA may be ensured.

The lower substrate 200 and the upper substrate 300 may be bonded to each other by a sealing member. The embossing member 700, formed on the upper substrate 300, physically presses the contact area CNT on the lower substrate 200 to breakdown the organic layer 230 having a weak mechanical strength, to thereby establish direct contact between the cathode electrode CD and the auxiliary electrode CA. When the cathode electrode CD and the auxiliary electrode CA may be electrically connected to each other, a surface resistance of the cathode electrode CD (e.g., formed as a thin film) may be reduced. Accordingly, a driving voltage may be reduced, which may thereby reduce power consumption.

Figure 5:
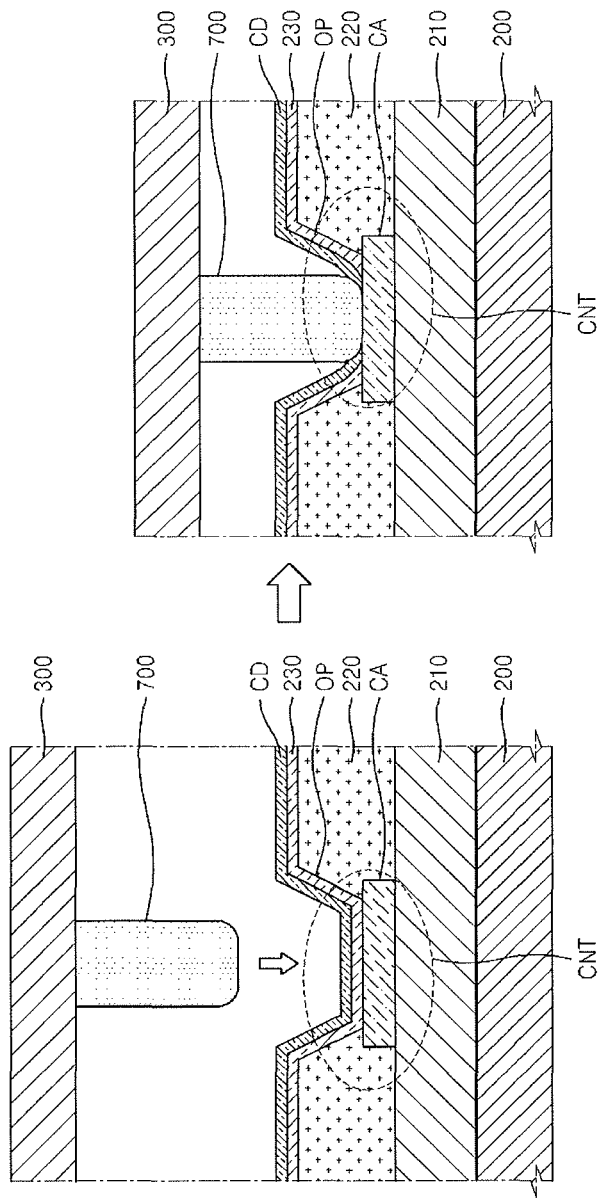
FIG. 5 illustrates another embodiment of a contact between a cathode and an auxiliary electrode of an organic light emitting display apparatus.

FIG. 5 illustrates another embodiment for establishing contact between the cathode electrode CD and the auxiliary electrode CA. Referring to FIG. 5, the auxiliary electrode CA is formed on the lower substrate 200, and the auxiliary electrode CA is partially exposed by an opening OP in a contact area CNT. One or more contact areas CNT may be formed. One or more insulating layers 210 and 220 may be formed between the lower substrate 200 and the cathode electrode CD. An organic layer 230 and the cathode electrode CD are sequentially formed in the opening OP of the auxiliary electrode CA. The organic layer 230 may include at least one of an HIL, an HTL, an ETL, or an EIL.

In addition, an embossing member 700 is formed on a surface of the upper substrate 300, which faces the lower substrate 200. The embossing member 700 is formed on a location corresponding to the contact area CNT of the lower substrate 200.

The lower substrate 200 and the upper substrate 300 may be bonded to each other by a sealing member. The embossing member 700, formed on the upper substrate 300, presses the contact area CNT of the lower substrate 200 to breakdown the organic layer 230 and the cathode electrode CD to directly contact the auxiliary electrode CA. Accordingly, the cathode electrode CD and the auxiliary electrode CA may be electrically connected to each other via the embossing member 700. As a result, surface resistance of the cathode electrode CD (e.g., formed as a thin film) may be reduced. Therefore, a driving voltage may be reduced, to thereby lower power consumption. In this case, the embossing member 700 may include a conductive material at a portion contacting the auxiliary electrode CA as shown in FIG. 4.

Figure 6:
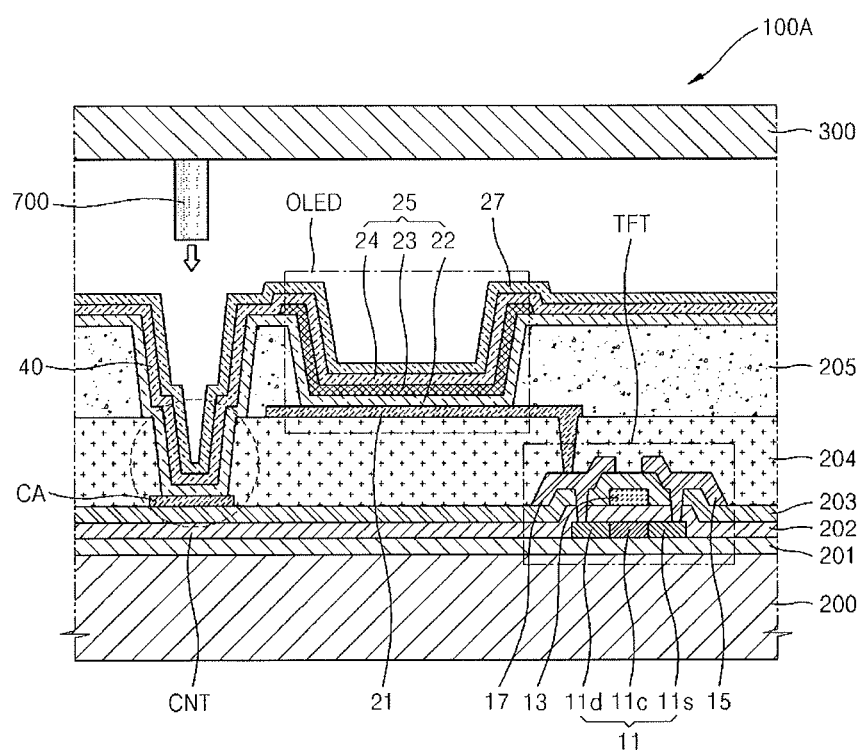
FIG. 6 illustrates a cross-sectional view of another embodiment of an organic light emitting display apparatus.

FIG. 6 illustrates a cross-sectional view of another organic light emitting display apparatus 100A. Referring to FIG. 6, a thin film transistor TFT and an organic light emitting device (OLED) are formed on a lower substrate 200 of the organic light emitting display apparatus 100A. The TFT includes an active layer 11, a gate electrode 13, and source/drain electrodes 15 and 17. The OLED includes a first electrode 21, an intermediate layer 25, and a second electrode 27.

First, the active layer 11 is formed on the lower substrate 200. The lower substrate 200 maybe formed of a transparent glass material including $SiO_2$ mainly. Alternatively, the lower substrate 200 may be formed of various other materials, for example, a transparent plastic material, or a metal material.

An auxiliary layer 201 may be selectively formed on the lower substrate 200. The auxiliary layer may be a barrier layer, a blocking layer, and/or a buffer layer for preventing diffusion of impurity ions, infiltration of moisture or external air, and for surface planarization.

The active layer 11 may be formed by patterning a polysilicon layer. The active layer 11 may further include semiconductor and may include ion impurities by a doping process. Also, the active layer 11 may be formed of an oxide semiconductor. The active layer 11 includes source/drain regions 11s and 11d doped by n-type or p-type impurities to correspond to opposite sides of the gate electrode 13, and a channel region 11c between the source and drain regions 11s and 11d.

A first insulating layer 202 and the gate electrode of the TFT are formed on the lower substrate 200, on which the active layer 11 is formed.

The first insulating layer 202 may be formed of an inorganic insulating layer such as $SiN_x$ or $SiO_x$ or an organic insulating layer on an entire surface of the lower substrate 200 using a plasma enhanced chemical vapour deposition (PECVD) method, an atmospheric pressure CVD (APCVD) method, and a low pressure CVD (LPCVD) method. The first insulating layer 202 may be disposed between the active layer 11 and the gate electrode 13 of the TFT to function as a gate insulating layer of the TFT.

The gate electrode 13 is formed to correspond to a center portion of the active layer 11, and may be formed of various conductive materials. For example, the gate electrode 13 may be formed to have a single-layered or a multi-layered structure including one or more materials selected from M Ag, Mg, Al, Pt, Pd, Au, Ni, Nd, Ir, Cr, Li, Ca, Mo, Ti, W, MoW, and Cu.

A second insulating layer 203 and the source/drain electrodes 15 and 17 of the TFT are formed on the lower substrate 200 on which the gate electrode 13 is formed.

The second insulating layer 203 may be formed of the same inorganic insulating material as that of the first insulating layer 202 on the entire surface of the lower substrate 200. The second insulating layer 203 functions as an interlayer dielectric between the gate electrode 13 and the source/drain electrodes 15 and 17 of the TFT.

Alternatively, the second insulating layer 203 may be formed of one or more organic insulating materials selected from the group consisting of polyimide, polyamide, acryl resin, benzocyclobutene, and phenol resin, as well as the inorganic insulating material, or may be formed to include an organic insulating material and an inorganic insulating material alternately. Contact holes exposing the source/drain regions 11s and 11d respectively are formed in the first insulating layer 202 and the second insulating layer 203.

The source/drain electrodes 15 and 17 may be formed of the same conductive material as that of the gate electrode 13 on the second insulating layer 203. In other embodiments, other conductive materials may be used. The source/drain electrodes 15 and 17 are electrically connected to the source/drain regions 11s and 11d of the active layer 11 via the contact holes formed in the first and second insulating layers 202 and 203.

In addition, the auxiliary electrode CA may be formed at the same layer as that of the source/drain electrodes 15 and 17 by a patterning process. In one embodiment, the auxiliary electrode CA may be formed around or adjacent the pixel electrode 21 in order to prevent an IR drop of the cathode electrode CD that is formed later. The auxiliary electrode CA may be formed of a material that is the same as or different from the source/drain electrodes 15 and 17. The auxiliary electrode CA may include a triple-layered structure including, for example, Mo/Al/Mo.

A third insulating layer 204 is formed on the source/drain electrode 15 and 17 and the auxiliary electrode CA. The third insulating layer 204 may be formed of one or more organic insulating materials selected from the group consisting of polyimide, polyamide, acryl resin, benzocyclobutene, and phenol resin by using a spin coating method. Alternatively, the third insulating layer 204 may be formed of an inorganic insulating material selected from $SiO_2$, $SiN_x$, $Al_2O_3$, $CuO_x$, $Tb_4O_7$, $Y_2O_3$, $Nb_2O_5$, and $Pr_2O_3$, as well as the organic insulating material.

Also, the third insulating layer 204 may be formed to have a multi-layered structure including the organic insulating material and the inorganic insulating material alternately. The third insulating layer 204 performs as a planarizing layer for protecting and planarizing the TFT.

The first electrode 21 is formed on the third insulating layer 204. The first electrode 21 may have a double-layered structure including a lower layer formed of a metal material having high reflectivity, for example, Ag, Mg, Al, Pt, Pd, Au, Ni, Nd, Ir, Cr, Li, Ca, and a compound thereof, and an upper layer formed of a transparent conductive material having a relatively high work function, for example, indium tin oxide (ITO), indium zinc oxide (IZO), ZnO, IGO, or $In_2O_3$.

The first electrode 21 is electrically connected to one of the source/drain electrodes 15 and 17 via the contact hole.

A fourth insulating layer 205 including an opening that exposing a part of the first electrode 21 is formed on the first electrode 21. The fourth insulating layer 205 functions as a pixel define layer (PDL). The fourth insulating layer 205 may be formed of one or more organic insulating materials selected from the group consisting of polyimide, polyamide, acryl resin, benzocyclobutene, and phenol resin by using a spin coating method. Alternatively, the fourth insulating layer 205 may be formed of an inorganic insulating material selected from $SiO_2$, $SiN_x$, $Al_2O_3$, $CuO_x$, $Tb_4O_7$, $Y_2O_3$, $Nb_2O_5$, and $Pr_2O_3$, as well as the organic insulating material. Also, the fourth insulating layer 205 may be formed to have a multi-layered structure including the organic insulating material and the inorganic insulating material alternately.

In addition, the third insulating layer 204 and the fourth insulating layer 205 on the auxiliary electrode CA are removed in the contact area CNT to expose a part of the auxiliary electrode CA. The intermediate layer 25 and the second electrode 27 are sequentially formed on the first electrode 21. The intermediate layer 25 includes a first organic functional layer 22, an organic emission layer 23, and a second organic functional layer 24. Locations of the first organic functional layer 22 and the second organic functional layer 24 may be exchanged according to functions of the first and second electrodes 21 and 27. One of the first organic functional layer 22 and the second organic functional layer 24 may be omitted. The first electrode 21 may function as an anode electrode and the second electrode 27 may function as a cathode electrode.

The first organic functional layer 22 may include at least one of a hole injection layer (HIL) and a hole transport layer (HTL), and is a common layer that is formed on the entire surface of the lower substrate 200.

The HIL may be formed to have a predetermined thickness so that holes may be injected easily, and the thickness may vary depending on materials forming the other layers. The HIL may be formed of phthalocyanine compound such as copper phthalocyanine, or TCTA, m-MTDATA, or m-MTDAPB that is star-bust type amine.

The HTL has high hole mobility to transport the holes easily, and a deposition condition and a coating condition of the HTL may vary depending on compounds that are used; however, may be selected from the conditions that are nearly the same as those of forming the HIL. The HTL may be formed of N,N'-bis(3-methylphenyl)-N,N'-diphenyl-[1,1-biphenyl]-4,4'-diamine (TPD), N,N'-di(naphthalene-1-yl)-N, N'-diphenyl benzidine (α-NPD), and the like.

The organic emission layer 23 is a patterned layer formed on the first electrode 21. The organic emission layer 23 may be formed of a low molecular weight or a high molecular weight organic material. If the organic emission layer 23 emits red light, green light, and blue light, the organic emission layer 23 may be patterned as a red light emission layer, a green light emission layer, and a blue light emission layer.

If the organic emission layer 23 emits white light, the organic emission layer 23 may have a multi-layered structure in which the red light emission layer, the green light emission layer, and the blue light emission layer are stacked. Alternatively, the organic emission layer 23 may have a single-layered structure including a red light emission material, a green light emission material, and a blue light emission material for emitting white light.

The organic emission material may include various light emitting materials, for example, oxadiazole dimer dyes (Bis-DAPDXP), spiro compounds (Spiro-DPVBi, Spiro-6P), triarylamine compounds, bis(styryl)amine (DPVBi, DSA), BCzVBi (4,4'-bis(9-ethyl-3-carbazole vinylene)-1,1'-biphenyl), perylene, TPBe (2,5,8,11-tetra-tert-butylperylene), BCzVB (9H-carbazole-3,3'-(1,4-phenylene-di-2,1-ethene-diyl)bis[9-ethyl-(9C)]), DPAVBi (4,4-bis[4-(di-p-tolil amino)styryl]biphenyl), DPAVB (4-(di-p-tolil amino)-4'-[(di-p-tolil amino)styryl]stilbene), BDAVBi (4,4'-bis[4-(diphenyl amino)styryl]biphenyl), FIrPic (bis(3,5-difluoro-2-(2-pyridyl)phenyl-(2-carboxy pyridyl)iridium III)), and the like (blue light); coumarin 6(3-(2-benzothiazolyl)-7-(diethyl amino)coumarin), C545T (2,3,6,7-tetra hydro-1,1,7,7,-tetra methyl-1H,5H,11H-10-(2-benzothiazolyl) quinolizino[9,9a, 1gh]coumarin, DMQA (N,N'-dimethyl-quinacridone), Ir(ppy)3 (tris(2-phenyl pyrydine)iridium (III)), and the like (green light); tetraphenylnaphthacene (Rubrene), Ir(piq)3 (tris(1-phenyl isoquinoline)iridium(III)), his (2-benzo[b] thiopene-2-yl-pyrydine) (acetyl acetonate)iridium (III) (Ir (btp)2(acac)), tris(dibenzoylmethane) phenanthroline europium (III) (Eu(dbm)3(phen)), tris[4,4'-di-tert-butyl-(2, 2')-bipyridyne]ruthenium (III) complex (Ru(dtb-bpy)3*2 (PF6)), DCM1, DCM2, Eu(TTA)3 (europium(thenoyltrifluoroacetone)3), CJTB (butyl-6-(1,1,7,7-tetramethyljulolidyl-9-enyl)-4H-pyran), and the like (red light).

Also, the light emitting material may be a high molecular light emitting material, for example, aromatic compounds including a polymer such as phenylene-based polymer, phenylene vinylene-based polymer, thiophene-based polymer, fluorine-based polymer, or spiro-fluorene-based polymer, and nitrogen; however, it is not limited thereto.

If necessary, the organic emission layer may include a light emitting host and a light emitting dopant. The light emitting dopant may include the above described light emitting material, and the light emitting host may include a fluorescent light emitting host material or a phosphorous light emitting host material. The fluorescent light emitting host material may be $Alq_3$, 9,10-di(naphty-2-yl)anthracene (AND), 2-tert-butyl-9, 10-bis-((β-naphthyl)-anthracene (TBADN), 4,4'-Bis(2,2-diphenylvinyl)-1,1'-biphenyl (DPVBi), 4,4'-Bis[2,2-di(4-methylphenyl)-ethen-1-yl]biphenyl (p-DMDPVBi), Tert(9, 9-diarylfluorene)s (TDAF), 2-(9,9'-spirobifluorene-2-yl)-9, 9'-spirobifluorene (BSDF), 2,7-bis(9,9'-spirobifluorene-2-yl)-9,9'-spirobifluorene (TSDF), Bis(9,9-diarylfluorene)s (BDAF), or 4,4'-bis(2,2-diphenyl-ethene-1-yl)-4,4'-di-(tert-butyl)phenyl (p-TDPVBi), and the phosphorous light emitting host material may be 1,3-bis(carbazol-9-yl)benzene (mCP), 1,3,5-Tris(carbazol-9-yl)benzene (tCP), 4,4',4"-Tris(carbazol-9-yl)triphenylamine (TcTa), 4,4'-N,N'-dicarbazole-biphenyl (CBP), 4,4'-bis(9-carbazolyl)-2,2'-dimethyl-biphenyl (CBDP), 4,4'-Bis(carbazol-9-yl)-9,9-dimethylfluorene (DMFL-CBP), 4,4'-bis(carbazole-9-yl)-9, 9-bis(9-phenyl-9H-carbazole)fluorene (FL-4CBP), 4,4'-bis(carbazol-9-yl)-9,9-ditolylfluorene (DPFL-CBP), or 9,9-bis 9-phenyl-9H-carbazol)fluorene (FL-2CBP). The dopant material of the organic emission layer may be 1,4'-bis[4-(di-p-tolylamino)styryl]biphenyl (DPAVBi), 9,10-di-(2-naphthyl)anthracene (ADN), or 2-tert-butyl-9,10-di(naphth-2-yl) anthracene (TBADN).

The second organic functional layer 24 may include at least one of an electron transport layer (ETL) and an electron injection layer (EIL), and is a common layer formed on the entire surface of the lower substrate 200. The ETL provide sufficient electron transport, and may be formed of $Alq_3$. The EIL performs injection of electrons, and may be formed of LiF, NaCl, CsF, $Li_2O$, BaO, or Liq.

The first and second organic functional layers 22 and 24 are common layers that are formed on the auxiliary electrode CA in the contact area CNT.

The second electrode 27 may be formed on the entire surface of the lower substrate 200 as a common electrode, and faces the first electrode 21. The second electrode 27 is formed of a thin transparent conductive material for performing top emission. Also, the second electrode 27 may be formed as a double-layered structure including a semi-transparent metal layer including metal having a small work function, that is, Ag, Mg, Al, Pt, Pd, Au, Ni, Nd, Ir, Cr, Li, Ca, and a compound thereof, and a transparent conductive layer formed of ITO, IZO, ZnO, or $In_2O_3$ on the semi-transparent metal layer.

In addition, the embossing member 700 is formed on a surface of the upper substrate 300. The upper substrate 300 may be formed of various materials, for example, a transparent glass material including $SiO_2$ mainly, a transparent plastic material, or a metal material, like the lower substrate 200.

The embossing member 700 may have a structure shown in FIG. 3 or FIG. 4, and one or more embossing members 700 may be formed to correspond to the contact area CNT. The embossing member 700 may be formed to have a sufficient height to press the contact area CNT, so that the second electrode 27 and the auxiliary electrode CA may be electrically connected to each other.

When the lower substrate 200 and the upper substrate 300 are bonded to each other, the embossing member 700 physically presses the second electrode 27 and the first and second organic functional layers 22 and 24 in the contact area CNT. As a result, the second electrode 27 and the auxiliary electrode CA contact each other as shown in FIG. 2, or the embossing member 700 directly contacts the auxiliary electrode CA as shown in FIG. 5, so that the second electrode 27 and the auxiliary electrode CA may be electrically connected to each other.

Figure 7:
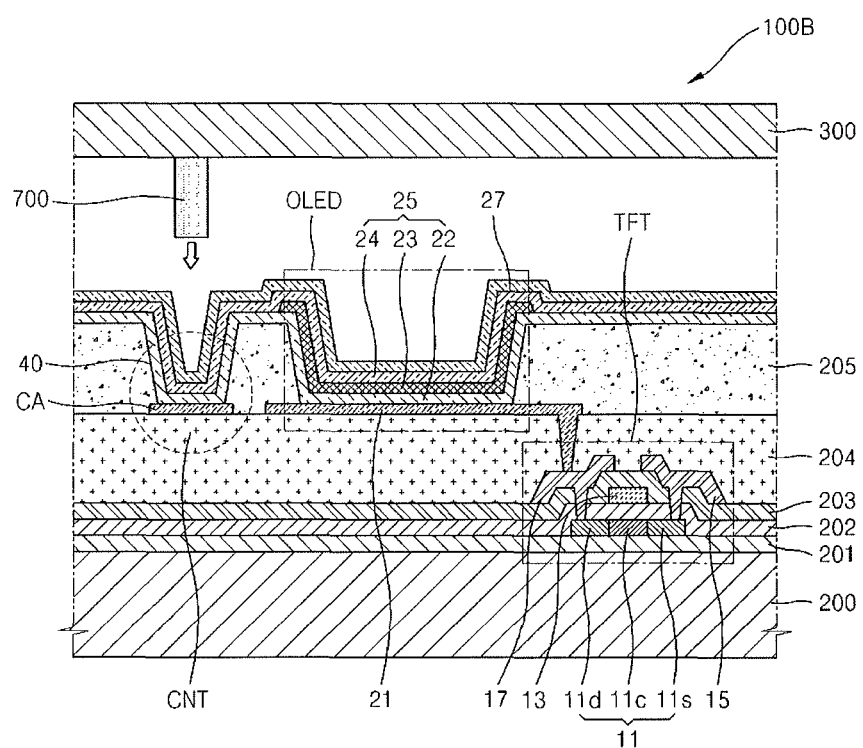
FIG. 7 illustrates a cross-sectional view of another embodiment of an organic light emitting display apparatus.

FIG. 7 illustrates another embodiment of an organic light emitting display apparatus 100B, which is different from the organic light emitting display apparatus 100A shown in FIG. 6 in that the auxiliary electrode CA is formed at the same layer as the first electrode 21.

Referring to FIG. 7, the TFT is formed on the lower substrate 200. The TFT includes the active layer 11 including the source/drain regions 11s and 11d, and the channel region 11c between the source/drain regions 11s and 11d, the gate electrode 13, and the source/drain electrodes 15 and 17.

The third insulating layer 204 is formed on the TFT, and an organic light emitting diode (OLED) that is electrically connected to the TFT is formed. The OLED includes the first electrode 21, the intermediate layer 25, and the second electrode 27.

The first electrode 21 and the auxiliary electrode CA are formed on the third insulating layer 204. The auxiliary electrode CA is formed around the first electrode 21 to be electrically insulated from the first electrode 21, and may be formed of a material that is the same as or different from that of the first electrode 21.

The first electrode 21 is electrically connected to one of the source and drain electrodes 15 and 17 via the contact hole. The first electrode 21 may have a double-layered structure including a lower layer formed of a metal material, having high reflectivity, for example, Ag, Mg, Al, Pt, Pd, Au, Ni, Nd, Ir, Cr, Li, Ca, and a compound thereof, and an upper layer formed of a transparent conductive material having a relatively high work function, for example, ITO, IZO, ZnO, IGO, or $In_2O_3$.

The fourth insulating layer 205 is formed and patterned on the first electrode 21 and the auxiliary electrode CA to form openings that expose a part of the first electrode 21 and a part of the auxiliary electrode CA.

The intermediate layer 25 and the second electrode 27 are sequentially formed in the opening that exposing the first electrode 21. The intermediate layer 25 includes the first organic functional layer 22, the organic emission layer 23, and the second organic functional layer 24. The first and second organic functional layer 22 and 24, and the second electrode 27 are formed on the exposed auxiliary electrode CA in the contact area CNT.

The embossing member 700 is formed on a surface of the upper substrate 300. The embossing member 700 may have a structure shown in FIG. 3 or FIG. 4, and one or more embossing members 700 may be formed to correspond to the contact area CNT. The embossing member 700 may be formed to have a sufficient height to press the contact area CNT, so that the second electrode 27 and the auxiliary electrode CA may be electrically connected to each other.

When the lower substrate 200 and the upper substrate 300 are bonded to each other, the embossing member 700 physically presses the second electrode 27 and the first and second organic functional layers 22 and 24 in the contact area CNT. As a result, the second electrode 27 and the auxiliary electrode CA contact each other as shown in FIG. 2. Alternatively, the embossing member 700 may directly contact the auxiliary electrode CA as shown in FIG. 5, so that the second electrode 27 and the auxiliary electrode CA may be electrically connected to each other.

In the above embodiments, the auxiliary electrode is formed at the same layer as the source/drain electrodes or the pixel electrode. In alternative embodiments, the auxiliary electrode may be formed at the same layer as the gate electrode or the active layer, or may be formed in other layers.

In the aforementioned embodiments, a coplanar type TFT is described as an example. In other embodiments, various other types of TFTs may be used, including but not limited to a staggered-type, an inverted staggered type, and an inverted coplanar type TFT.

In a light emitting device where the second electrode is a common electrode, i.e., supplies the same voltage to all pixels, a voltage drop (IR drop) occurs due to high specific resistance of the second electrode. As a result, voltages of different levels are applied to the pixels based on to their respective locations.

By way of summation and review, embodiments relate to an organic light emitting display apparatus suitable for mass production of large-sized substrates, and capable of reducing voltage drop in an electrode to which a driving voltage is applied.

According to one or more embodiments, an auxiliary electrode is formed under the cathode electrode. The cathode electrode and the auxiliary electrode are then electrically connected to each other via the contact hole. Such an arrangement may be suitable fabricating an enlarged display apparatus, when compared to the case where the auxiliary electrode is directly formed on the cathode electrode by using a fine metal mask (FMM) process.

According to one or more embodiments, the auxiliary electrode contacting the cathode electrode may be used to prevent electrical characteristics of a top emission-type display apparatus from degrading. The organic material formed on the auxiliary electrode may be removed using the embossing member formed on the upper substrate to prevent the contact defects due to the organic material. Thus, an electrical path between the auxiliary electrode and the cathode electrode may be easily formed. Accordingly, the embodiments may be suitable for mass production of large sized substrates. In addition, the IR drop of the electrode to which the driving voltage is applied may be reduced, to improve unevenness of brightness. Thus, a display apparatus of high resolution may be realized.

According to one or more embodiments, the embossing member may be formed on the upper substrate to correspond to the contact area where the second electrode and the auxiliary electrode on the lower substrate are electrically connected to each other. This may ensure electrical connection between the second electrode and the auxiliary electrode. These embodiments are suitable for the mass production of a large sized substrate, and also an organic light emitting display apparatus of high resolution may be manufactured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display apparatus, comprising:
 a first substrate including a light emitting device having an organic emission layer between first and second electrodes, and an auxiliary electrode directly contacting the second electrode; and
 a second substrate including an embossing member at a surface facing the first substrate, wherein the embossing member contacts the second electrode.

2. The apparatus as claimed in claim 1, wherein the light emitting device further comprises an organic functional layer disposed between at least one of the first electrode or the second electrode and the organic emission layer, the organic functional layer extending outside an area where the auxiliary electrode contacts the second electrode.

3. The apparatus as claimed in claim 2, wherein the organic functional layer comprises at least one of a hole injection layer, a hole transport layer, an electron transport layer, or an electron injection layer.

4. The apparatus as claimed in claim 1, wherein the embossing member directly contacts the auxiliary electrode.

5. The apparatus as claimed in claim 1, wherein the embossing member directly contacts a top surface of the second electrode.

6. The apparatus as claimed in claim 2, wherein the auxiliary electrode and the second electrode contact one another through a break area in an organic functional layer.

7. The apparatus as claimed in claim 1, wherein the embossing member includes an organic insulating material.

8. The apparatus as claimed in claim 1, wherein the embossing member comprises a first pattern which includes an organic insulating material and a second pattern which includes a conductive material on the first pattern.

9. The apparatus as claimed in claim 1, wherein the first substrate comprises a thin film transistor electrically connected to the first electrode of the light emitting device.

10. The apparatus as claimed in claim 9, wherein the auxiliary electrode is at a same level as a conductive layer configuring the thin film transistor.

11. The apparatus of claim 9, wherein the auxiliary electrode is at a same level as the first electrode of the light emitting device.

12. An organic light emitting display apparatus, comprising:
a first electrode on a first substrate;
a second electrode facing the first electrode;
an organic emission layer between the first and second electrodes and an organic functional layer between at least one of the first electrode or second electrode and the organic emission layer;
an auxiliary electrode in direct contact with the second electrode; and
an embossing member coupled to a surface of a second substrate which faces the lower substrate, wherein the embossing member contacts at least one of the auxiliary electrode or the second electrode of the first substrate.

13. The apparatus as claimed in claim 12, wherein the organic functional layer comprises at least one of a hole injection layer, a hole transport layer, an electron transport layer, or an electron injection layer.

14. An organic light emitting diplay apparatus, comprising:
a first electrode on a lower substrate;
a second electrode facing the first electrode;
an organic emission layer between the first and second electrodes and an organic functional layer between at least one of the first electrode or second electrode and the organic emission layer;
an auxiliary electrode electrically connected to the second electrode; and
an embossing member coupled to an upper substrate which faces the lower substrate, wherein the embossing member directly contacts the auxiliary electrode.

15. The apparatus as claimed in claim 12, wherein the embossing member directly contacts a top surface of the second electrode.

16. The apparatus as claimed in claim 12, wherein the embossing member includes an organic insulating material.

17. The apparatus as claimed in claim 12, wherein the embossing member comprises a first pattern including an organic insulating material and a second pattern including a conductive material on the first pattern.

18. The apparatus as claimed in claim 12, wherein the organic functional layer is located outside of an area where the auxiliary electrode contacts the second electrode.

19. The apparatus as claimed in claim 18, wherein the auxiliary electrode and the second electrode contact one another through a break area in the organic functional layer.

20. The apparatus as claimed in claim 8, wherein the second pattern of the embossing member contacts at least one of the auxiliary electrode or the second electrode.

21. The apparatus as claimed in claim 17, wherein the second pattern of the embossing member contacts at least one of the auxiliary electrode of the second electrode.

* * * * *